(12) United States Patent
Wang et al.

(10) Patent No.: US 8,329,251 B2
(45) Date of Patent: Dec. 11, 2012

(54) METHOD FOR PREPARING METAL OXIDE CRYSTALLINE NANOPARTICLE FILMS FOR DYE SENSITIZED SOLAR CELL PHOTOANODES

(75) Inventors: Hai Wang, Arcadia, CA (US); Denis J. Phares, Pasadena, CA (US); Erik Tolmachoff, Los Angeles, CA (US)

(73) Assignee: University of Southern California, Los Angeles, CA (US)

( * ) Notice: Subject to any disclaimer, the term of this patent is extended or adjusted under 35 U.S.C. 154(b) by 719 days.

(21) Appl. No.: 12/396,200

(22) Filed: Mar. 2, 2009

(65) Prior Publication Data

US 2009/0220702 A1   Sep. 3, 2009

Related U.S. Application Data

(60) Provisional application No. 61/032,862, filed on Feb. 29, 2008.

(51) Int. Cl.
   *B05D 3/08* (2006.01)
(52) U.S. Cl. ........................................ 427/223; 427/224
(58) Field of Classification Search .................. 427/223, 427/224
   See application file for complete search history.

(56) References Cited

U.S. PATENT DOCUMENTS

| 4,842,832 A | 6/1989 | Inoue et al. |
| 5,350,644 A | 9/1994 | Graetzel et al. |
| 5,358,695 A | 10/1994 | Helble et al. |
| 5,447,708 A | 9/1995 | Helble et al. |
| 5,840,373 A | 11/1998 | Hahn et al. |
| 6,242,049 B1 | 6/2001 | McCarty et al. |
| 6,777,374 B2 | 8/2004 | Sahle-Demessie et al. |
| 2009/0032105 A1* | 2/2009 | Inoue et al. ................... 136/263 |

FOREIGN PATENT DOCUMENTS

| EP | 1443271 A1 | 4/2004 |
| KR | 1020070068216 A | 6/2007 |
| RU | 2157485 C1 | 10/2000 |

(Continued)

OTHER PUBLICATIONS

Gratzel, Dye-sensitized solar cells, Journal of Photochemistry and Photobiology C: Photochemistry Reviews, 4 (2003) pp. 145-153.*

(Continued)

*Primary Examiner* — Kelly M Gambetta
(74) *Attorney, Agent, or Firm* — McDermott Will & Emery LLP

(57) ABSTRACT

A method for manufacturing a dye sensitized nanocrystal film having the steps of exposing a tin oxide layer on a surface of a substrate to a flame for a time sufficient to form a layer of mesoporous, crystalline titanium oxide on the fluorinated tin oxide layer followed by sintering the substrate at a temperature of from about 300 to about 500° C. The flame contains a fuel gas, such as ethylene and oxygen and titanium organometallic. The concentration of titanium organometallic is from about 10 to about 2000 ppm. During the flame exposure step, the substrate is rotated about a central axis at a speed of from about 100 to about 600 RPM, and the flame is kept at a constant distance from the surface of the substrate. The temperature of the substrate is maintained at a temperature of less than 200° C. via the rotation and jets of gas.

11 Claims, 4 Drawing Sheets

FOREIGN PATENT DOCUMENTS

WO  2009114851 A2  9/2009

OTHER PUBLICATIONS

Cha et al. Stabilization of Premixed Flames on Rotating Bunsen Burners, Combustion and Flame, 106 (1996) oo 467-477.*

Zhao et al. Ultrafine anatase TiO2 nanoparticles produced in premixed ethylene stagnation flame at 1 atm, Proceedings of the Combustion Institute, 30 (2005) pp. 2569-2576.*

Hara, K. et al. 2003. Dye-Sensitized Solar Cells. In Handbook of Photovoltaic Science and Engineering. Chichester, West Sussex, UK, John Wiley & Sons, 38 pages.

McCormick, J.R. et al. 2004. Thermal Stability of Flame-Synthesized Anatase TiO2 Nanoparticles. J. Phys. Chem B, 2004, vol. 108, pp. 17398-17402.

Skandan, G. et al. 1998. Low-Pressure Flame Deposition of Nanostructured Oxide Films. Journal of the American Ceramic Society, vol. 81, No. 10, pp. 2753-2756.

Tolmachoff, E.D. et al. 2007. Flame Synthesis of Nanophase TiO2 Crystalline Films. In Proceedings of the 5th US Combustion Meeting, U.C. San Diego, Mar. 25-28, 2007, Paper #H15, 9 pages.

Zhao, B. et al. 2005. Ultrafine Anatase TiO2 Nanoparticles Produced in Premixed Ethylene Stagnation Flam at 1 atm. Proceedings of the Combustion Institute, vol. 30, pp. 2569-2576.

Zhao, B. et al. 2007. A Comparative Study of Nanoparticles in Premixed Flames by Scanning Mobility Particle Sizer, Small Angle Neutron Scattering, and Transmission Electron Microscopy. Proceedings of the Combustion Institute, vol. 31, pp. 851-860.

Zhao, H. et al. 2008. Control of Nanoparticle Size and Agglomeration Through Electric-Field-Enhanced Flame Synthesis. Journal of Nanoparticle Research, vol. 10, pp. 907-923.

Zhao, Z. et al. 2002. Transparent Conducting ZnO:Al Films Via CCVD for Amorphous Silicon Solar Cells. Preprint of Poster presented at 19th IEEE PVSC New Orleans Meeting, May 20-24, 2002, 4 pages.

* cited by examiner

METHOD FOR PREPARING METAL OXIDE CRYSTALLINE NANOPARTICLE FILMS FOR DYE SENSITIZED SOLAR CELL PHOTOANODES

CROSS REFERENCE TO RELATED APPLICATION

This application is based upon and claims the benefit of priority from Provisional U.S. Patent Application 61/032,862 filed on Feb. 29, 2008, the entire contents of which are incorporated by reference herein.

BACKGROUND

1. Technical Field

The present disclosure relates to the manufacture of mesoporous, crystalline nanoparticle films. Particularly, this disclosure relates to the manufacture of titania nanoparticle films for use as dye sensitized solar cells via flame deposition of metal oxide nanoparticles onto transparent conductive substrates.

2. Background

Fossil fuels currently supply the majority of energy needs in the world and are necessary to run the global economy. However, concerns over the environmental effects of fossil fuel use, as well as questions regarding the long term supply of fossil fuels have created issues with regard to the future use of fossil fuels. In order to overcome the dependence on fossil fuels, other methods, such as wind, hydroelectric and solar, are increasingly being examined for use as alternative energy generation methods. Despite the ubiquitous abundance of solar energy around the globe, converting this energy to usable electrical energy remains expensive using current photovoltaic technologies. Electricity produced using existing photovoltaic cells remain at least a factor of 2 more expensive than electricity produced from fossil fuel burning, wind, and hydroelectric sources. Additionally, efficient crystalline silicon cells are energy intensive to produce due to the high energies associated with producing molten silicon.

Mesoporous, thin-films of titanium oxide (titania, $TiO_2$) nanoparticles have many applications including dye sensitized solar cells (DSSC) and gas-sensors. In DSSC, a thin film of porous nanocrystalline titania several micrometers in thickness serves to immobilize a photosensitive dye containing ruthenium atoms in a complex of molecular ligands and anchoring groups. Photoexcitation of the dye leads to charge separation and metal-to-ligand charge transfer, that injects electrons into the conduction band in $TiO_2$. For gas-sensors the film acts as an atmosphere-dependent resistor, whereby the conductance across the particle film changes by the surface adsorption of an atmospheric trace species. Thin films of titania nanoparticles may be fabricated by various methods such as sol-gel spin coating, screen printing, spray pyrolysis and doctor blading.

Currently, sol-gel and spray pyrolysis are the methods of choice in synthesizing titania nanoparticles. The sol-gel method involves gelling a colloidal suspension while spray pyrolysis uses a flame, laser, or electrical discharge to turn the precursor aerosol into nanometer scale metal oxide particles. Both of these methods can make fine particles, but the resulting particle size distributions are wide when compared to the Flame Stabilized on a Rotating Surface (FSRS) process—the principal method of the present disclosure. Sol-gel can combine nanoparticle synthesis and film deposition in a single step, but the nanoparticles are generally amorphous and flame aerosol deposition processes can deposit crack free, but mesoporous films. Although the sol-gel method affords some control over the size as well as the size distribution of the particles, the particles must be dried and often need to be calcinated to obtain the desired morphology, often at the expense of the particle size due to sintering. Furthermore, dry processes may be more commercially viable because they typically require less post processing.

In addition, existing techniques employ a three-step method to produce the film. First the nanoparticles are produced by sol gel or flame spray pyrolysis. Second the particles are mixed into an ethyl cellulose paste. And third, the paste is screen printed or squeegeed onto the transparent conducting substrate. By contrast, the FSRS method is a one-step method, where the particles are produced and deposited into a thin film using a single process.

The DSSC design represents a significant paradigm shift in solar cell technology. It is considered to be an attractive alternative to existing designs because of the low cost of the materials that comprise the bulk of the cell—namely an iodine/iodide-based electrolyte, and the titania film. The platinum catalyst and dye (usually ruthenium-based) are used in such small quantities that they do not contribute significantly to the material cost of the cell. The present disclosure focuses on further lowering the costs per unit power produced by cell not only by increasing the efficiency of the cells as described above, but also by reducing the costs associated with depositing the titania film.

SUMMARY

In order to overcome the above mentioned problems, this disclosure identifies a methodology for fabricating the photoanode of a dye sensitized solar cell (DSSC), wherein the photocatalyst is made of a mesoporous, thin film of $TiO_2$ nanoparticles coated with a light absorbing dye. Crystalline $TiO_2$ nanoparticles of well defined median sizes and narrow size distributions are produced using Flame Stabilized on a Rotating Surface (FSRS), whereby a thin film of nanoparticles is deposited continuously on an electrically conducting, transparent substrate. The flame is established by a flow of combustible gases (e.g., ethylene and air) through an aerodynamic nozzle and stabilized into a thin sheet by flame stretch below the rotating surface. Particle deposition is driven by thermophoresis due to a sharp temperature gradient between the flame sheet and the cool moving substrate.

One embodiment of the present disclosure describes a method for manufacturing a dye sensitized nanoparticle film comprising the steps of exposing a fluorinated tin oxide (FTO) substrate to a flame for a time sufficient to form a layer of crystalline titanium oxide; and after exposing the FTO layer, sintering the substrate at a temperature of from about 300 to about 500° C. The flame contains a fuel gas and titanium organometallic and the concentration of titanium organometallic is from about 2 to about 200 ppm of the total composition of the flame. In other embodiments the titanium organometallic is in the form of titanium tetraisopropoxide.

In another embodiment, the fuel gas is comprised of ethylene and oxygen. Additionally, the fuel gas may contain argon.

In another embodiment, the transparent conducting layer is a tin-doped indium oxide (ITO). Additionally, the substrate on which the ITO layer rests is comprised of glass.

In other embodiments of the present disclosure, during the flame exposure step, the substrate is rotated about a central axis, and the flame is kept at a constant distance from the surface of the substrate. In some embodiments, the substrate is rotated at a speed of from about 100 to about 600 revolutions per minute. Additionally, the temperature of the substrate is maintained at a temperature of less than 200° C. The substrate temperature is maintained via the rotation of the disc and additionally maintained by use of at least one jet of gas directed to the surface of the substrate to cool the surface of the substrate. In other embodiments, the jet of gas is one or more from the group consisting of oxygen, nitrogen and argon.

Additional advantages and other features of the present disclosure will be set forth in part in the description which follows and in part will become apparent to those having ordinary skill in the art upon examination of the following or may be learned from the practice of the disclosure. The advantages of the disclosure may be realized and obtained as particularly pointed out in the appended claims.

As will be realized, the present disclosure is capable of other and different embodiments, and its several details are capable of modifications in various obvious respects, all without departing from the disclosure. Accordingly, the drawings and description are to be regarded as illustrative in nature, and not as restrictive.

DETAILED DESCRIPTION OF ILLUSTRATIVE EMBODIMENTS

Flame Stabilized on a Rotating Surface (FSRS) is a method for producing and depositing crystalline anatase- or rutile-phase titania into a thin film. In the case of dye sensitized solar cells, the titania nanoparticle layer is critical to the performance of the cell. Moreover, because the chemical and physical properties of nanoparticles depend strongly on the particle size, crystallinity, and morphology, processes that can tune and control these characteristics are needed for optimizing DSSC. This disclosure demonstrates that FSRS produces titania particles having a reproducible and narrow size distribution and high crystalline content. These properties are needed for the particles to efficiently adsorb the light-absorbing dye, while at the same time allowing the electron produced upon light absorption to diffuse out of the cell.

The FSRS method uses a laminar, premixed gas jet composed of a combustible fuel-air mixture. The titanium precursor can be any titanium organometallic or inorganic compound having a sufficiently high vapor pressure at temperatures below 300° C. The titanium precursor is injected into the combustible fuel-air mixture by a syringe pump. In one embodiment, the titanium precursor is titanium tetraisopropoxide (TTIP). The gas jet is ejected continuously through an aerodynamically shaped nozzle and impinged onto the rotating surface where substrates for particle film deposition are mounted. Upon flame ignition, a thin, flat flame may be established a few millimeters beneath the surface. Titania nanoparticles form upon oxidation of the precursor and nucleation of the resulting metal oxide vapor. Because the temperature of the flame sheet can exceed 2000° C. and that of the rotating surface is substantially less, the large temperature gradient causes a limited particle lifetime in the flame, from particle nucleation and growth to deposition onto the substrate. The large temperature gradient also gives rise to a driving force, due to thermophoresis, which causes particle deposition onto the substrate.

Figure 1:
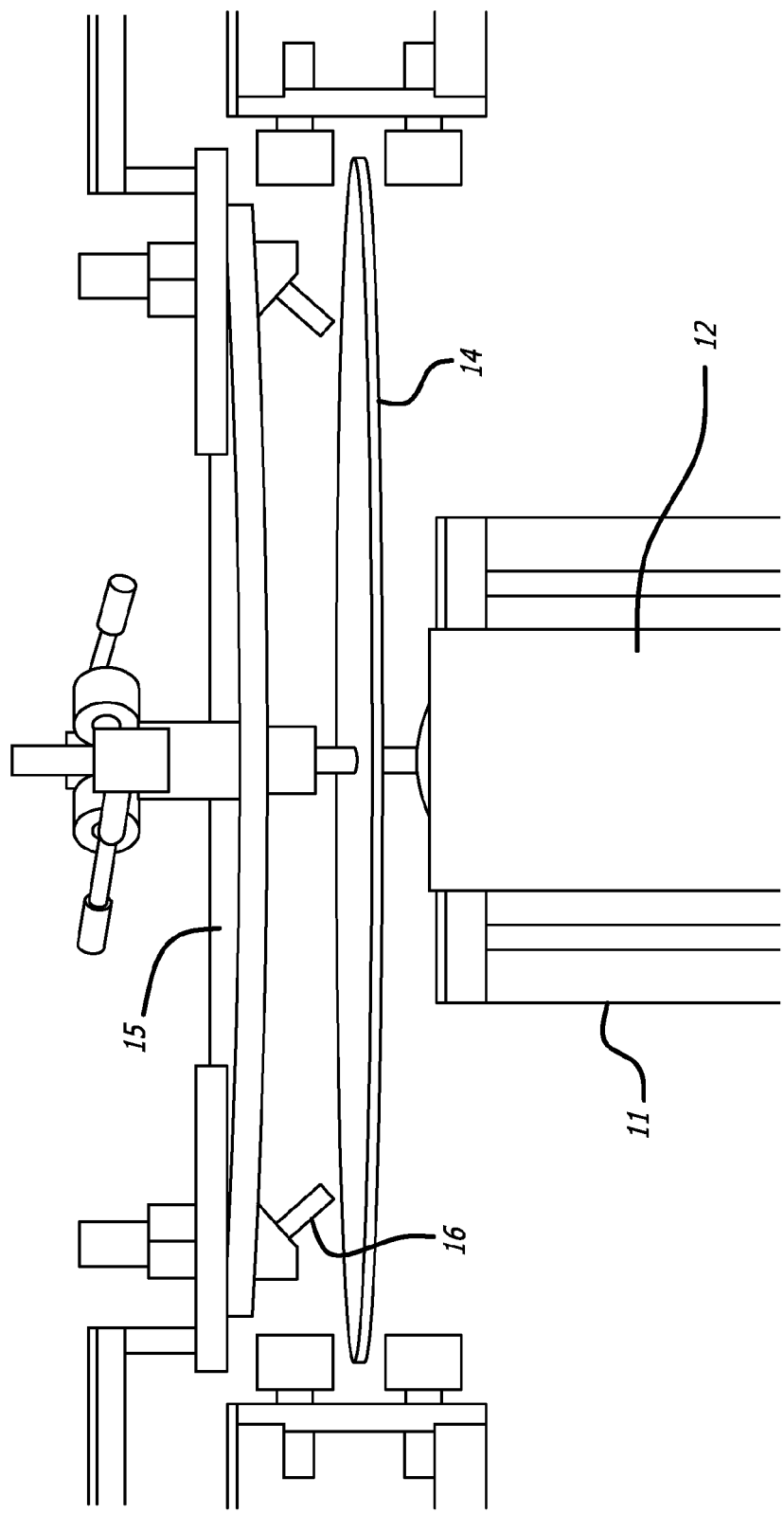
FIG. 1 is a bottom elevational view of a burner according to one embodiment of the present disclosure.

A burner assembly used in the manufacture of the nanocrystalline films is shown schematically in FIG. 1. The burner 11 consists of an aerodynamically shaped nozzle 12 with a 1-cm exit diameter to generate a stagnation gas jet against a circular titanium disc 14, 30 cm in diameter. The nozzle exit is placed 3.4 cm from the disc 14. Furthermore, the rotating disc convectively cools the substrate via a rotating motion, thereby allowing the substrate temperature to be controlled by the rotation speed. The temperature may be further adjusted by gas jets 16 on the cooling assembly 15 placed above the disc. Generally, any inert gas jet which sufficiently cools the substrate may be used. In some embodiments, air and nitrogen gas jets are used. The flow rate also should be sufficient to cool the substrate to the temperature desired. In one embodiment, the flow rate of the gas jets is 40 L/min at STP. In addition, multiple jets may be used. For example, in FIG. 1, two equally spaced jets were used. However, depending on the size of the substrate, more or less jets may be used.

Compared to existing particle synthesis methods, FSRS offers three distinctive advantages. First, the moving substrate serves the dual function of synthesis flame stabilization and thereby, nanoparticle synthesis, and nanoparticle collection and deposition into a thin film in a single step. Second, the flame sheet is uniform in the directions perpendicular to the gas flow, thereby ensuring uniformity of particle synthesis process in those spatial directions and thus uniform particle size. And third, methods by which the nanoparticle size and film thickness are controlled are by injecting the titanium precursor at different rates, by rotating the surface at different speeds, and by injecting the unburned gas flow at different speeds. These features allow a wide range of nanoparticle sizes to be synthesized and films of different thicknesses to be prepared in a single step.

Not to be held by theory, solar cells operate on the principle that a photon may be absorbed by a material creating an electron-hole pair in the material, and that the electron may be separated from the hole and extracted to power a load. The dye sensitized solar cell, originally described by Gratzel and his group in 1990, represents the only photovoltaic cell that does not rely on the field produced at a pn-junction for separation of the electron from the hole. The basic premise of a DSSC is that a light-sensitive dye absorbs a photon, thus exciting an electron to a higher energy state within the dye molecule, leaving behind an electron vacancy (or hole). The separation of the electron from its hole occurs if the dye is chemisorbed onto a titania crystal. This separation occurs because the conduction band energy of crystalline titania is slightly lower than the energy of the excited electron. Thus, the excited electron is efficiently injected into the conduction band of the titania. Meanwhile, the hole in the dye molecule is replenished through donation of an electron from an oxidation reaction (typically $3I^-\rightarrow I_3^-+2e^-$) that occurs in an electrolyte that surrounds the dye molecule. Assuming the electron does not recombine with another hole, it diffuses through the titania film and a transparent conducting layer, through the load, and then returns to the cathode of the cell. The electrolyte, which is also in contact with the cathode, completes the circuit by using the electron in the reduction of $I_3^-$ to $3I^-$. This reduction reaction requires a platinum catalyst to occur on the required timescale of the cell.

A DSSC anode is made by depositing a mesoporous, titania nanoparticle film onto a transparent conductive film, sintering the nanoparticle film, and then staining the film with a light sensitive dye. The transparent conductor is necessary because the titania film is not a conductive film. The sintering of the film at temperatures above about 300° C. is essential for the structural integrity of the film and for enhancing the electron diffusivity of the film. Consequently, the substrate must be able to withstand such temperatures (e.g. glass). The quality of the titania film is absolutely essential to the performance of the cell in terms of its photoefficiency. In general, one must maximize the number of electrons produced by the cell for a fixed number of photons hitting the anode. This requires 1) a high density of dye molecules for photon absorption, 2) a high rate of redox reactions to replenish the electron holes and 3) a high conductivity for electrons to easily exit the cell upon excitation. All of these parameters may be optimized using the FSRS process for fabricating the titania nanoparticles film.

The first issue requires a titania film having a high surface area density. High surface area allows a greater number of dye molecules to attach per unit volume. This in turn requires a smaller titania particle size. One of the main advantages of the FSRS process is the short growth time of the nanoparticles because of the small distance between the flame and the substrate. Particle films having an average grain size as small as 5 nanometers in diameter and a narrow size distribution may be produced on the substrate. The thermophoretic force starts to vanish below this limiting size. However, as the particle size decreases, the pore size also decreases; and this may in turn limit the transport of the electrolyte throughout the anode. Thus in order to maintain the second requirement—a high redox reaction rate—one must also ensure a high porosity in order for efficient transport of the $I^-$ ions to the dye molecules located throughout the film. On a related note, a high porosity is also needed in order to stain the entire film with dye. Otherwise the dye solution and the dye molecules themselves would be unable to access particles located closer to the substrate, where the incident photon flux is highest. Thus, it is expected the optimum particle size comprising the porous film is closer to 10 nanometers. Finally, the third requirement is satisfied because the FSRS process produces particles that are near 100% crystalline. The crystallinity ensures high electron diffusivity, and thus a higher photocurrent that may be produced by the cell. Furthermore, when the film is sintered as required for sufficient adhesion and conductivity through grain boundaries, the high crystallinity of the particles aids in maintaining their original small grain size, so that the surface area density remains high.

In the present disclosure, the synthesis of $TiO_2$ nanoparticles using a flame technique in which particles are produces from a nearly one-dimensional stagnation flame may be controlled to produce the desired range of particle sizes and porosities. Factors in controlling these parameters are the substrate or disc rotation speed, the use of jets of gas to cool the substrate, the concentration of titanium in the flame, and the fuel gas exit velocity.

Figure 2:
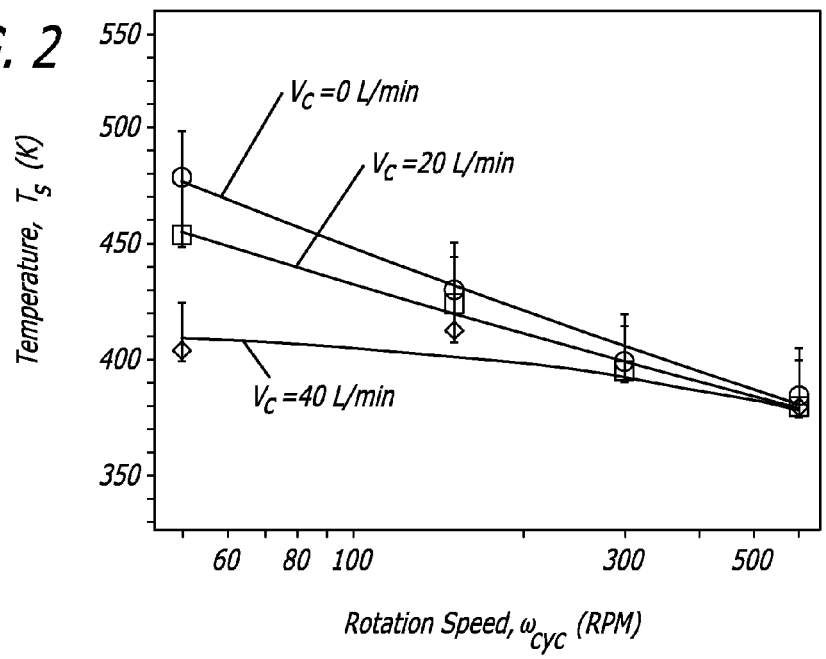
FIG. 2 is a graph showing the relationship between disc rotation speed and gas jet velocity vs the temperature of a substrate according to one embodiment of the present disclosure.

The disc rotation speed controls the temperature of the substrate. FIG. 2 shows the effect of the rotation speed and the flow rate of the jets of gas on the temperature of the substrate. The figure demonstrates how the disc is progressively cooled by increasing rotation speed. For disc rotation of greater than 300 RPM, or an equivalent local linear translating velocity of 380 cm/s, the disc temperature becomes independent of the flow rate of the jets of gas, indicating that the rotationally induced convection dominates the heat transfer. At or below 150 RPM, however, forced convection by the jet or jets of gas is a major component to keeping the disc cool. In addition, at 40 L/min flow rate of the jet or jets of gas, the disc temperature is maintained below 420 K regardless of the rotation rate.

Figure 3:
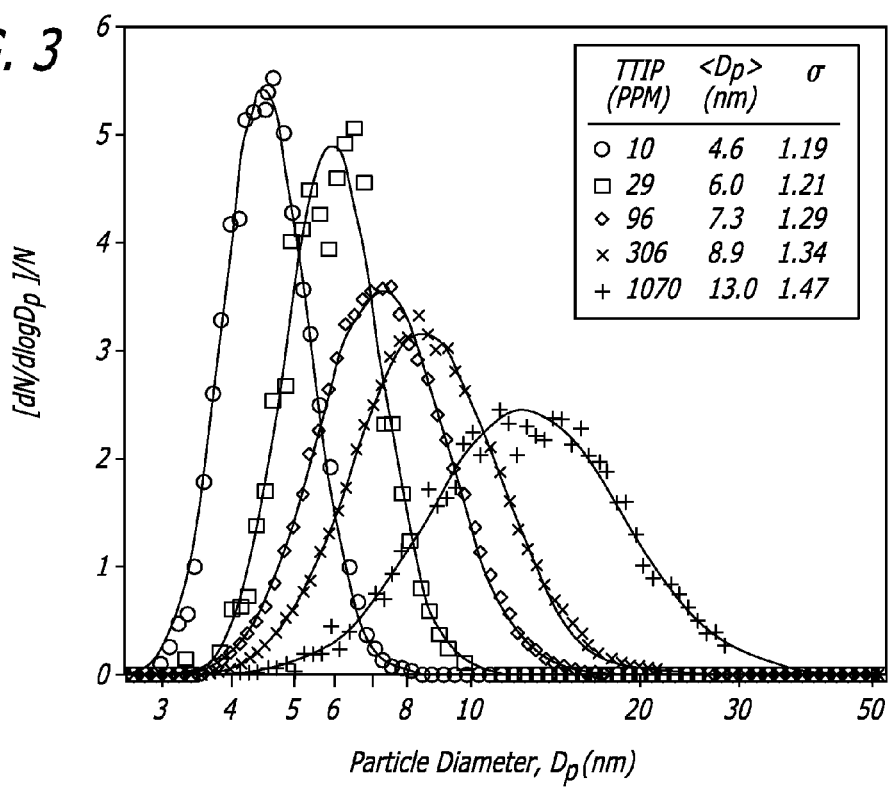
FIG. 3 is a graph showing the relationship of particle size with the change of TTIP concentration in the flame according to one embodiment of the present disclosure.

The particle size of the titania may be controlled by adjusting the Ti loading in the flame. FIG. 3 shows the variation of the particle size diameters with respect to concentration of titanium tetraisopropoxide (TTIP). As is shown, as the concentration of TTIP in the flame is increased, the particle size increases and distribution widens. The median diameter ($D_p$) varies from 4.6 to 13 nm. Particles grown form TTIP concentrations of 306 ppm by mole (same PPM Ti) display a high degree of monodispersity. The geometric standard deviation is below that of a self-preserving size distribution having $\sigma$~1.45, indicating that coalescence growth is limited. At 1070 PPM TTIP, the median diameter is 13 nm.

Figure 4:
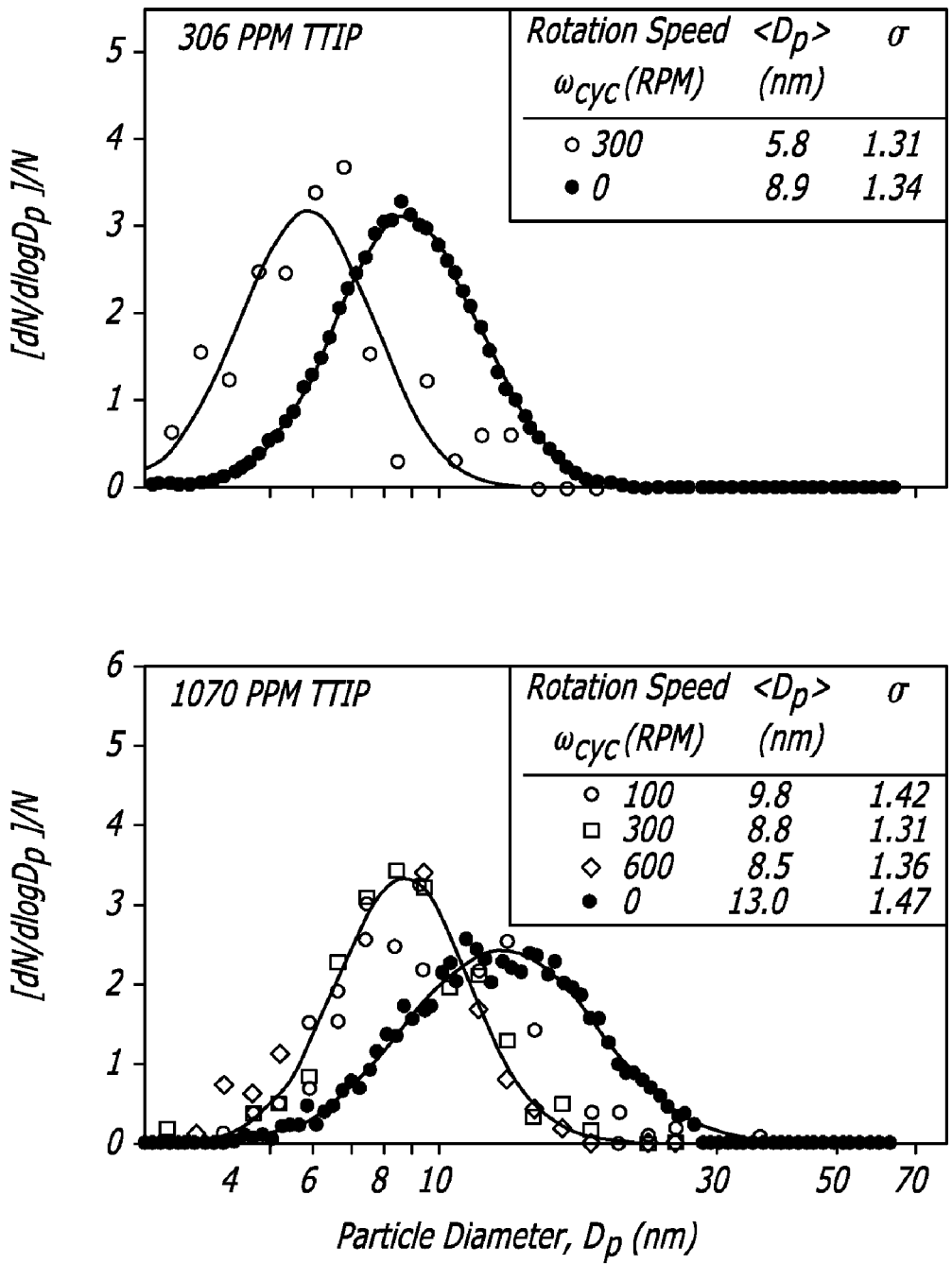
FIG. 4 is a graph showing the relationship of particle size with the change of disc rotation speed according to one embodiment of the present disclosure.

The disc rotation speed also controls the particle size distribution. FIG. 4 shows the size distributions of particles grown from two TTIP loadings and collected at several disc rotation speeds. As is shown, at 1070 PPM TTIP (same PPM Ti), the median diameter drops from 13 nm at zero disc speed to about 9 nm at speeds from 100 to 600 RPM. Without rotation, the absence of convective cooling allows the local temperature of the disc to reach 1000 K. Consequently, the temperature gradient and resulting thermophoretic velocities decrease resulting in longer particle growth times. Hence, the rotation of the disc controls the surface temperature and, subsequently, through the thermophoretic force, indirectly controls the particle growth time and properties.

Figure 5:
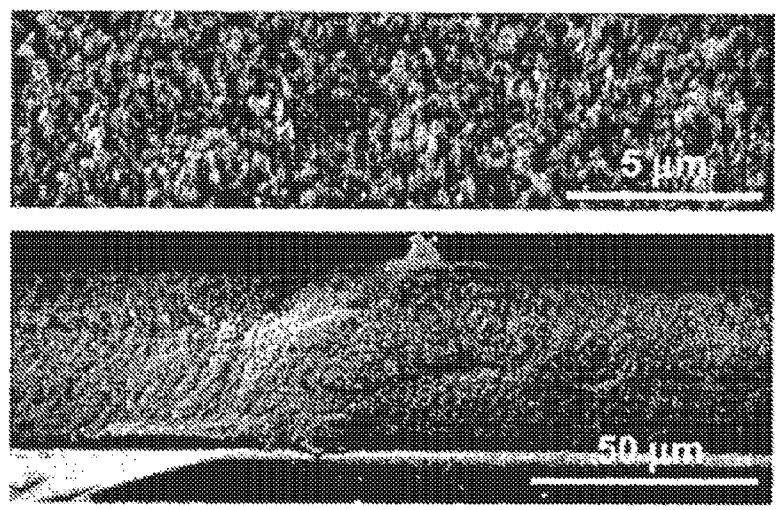
FIG. 5 is an SEM image of a mesoporous film of titania particles deposited on a substrate according to another embodiment of the present disclosure.

SEM analysis of the films confirms that uniform porous films can be generated in relatively short periods of time on both glass and alumina. FIG. 5 shows a typical SEM image for a mesoporous, particle film deposited for 15 min at 300 RPM spin rate with a TTIP concentration of 1070 PPM. Under these conditions, the film grows 45 µm over a period of 10-15 min. Typical film thicknesses are 10-20 µm for DSSC.

The present disclosure can be practiced by employing conventional materials, methodology and equipment. Accordingly, the details of such materials, equipment and methodology are not set forth herein in detail. In the previous descriptions, numerous specific details are set forth, such as specific materials, structures, chemicals, processes, etc., in order to provide a thorough understanding of the disclosure. However, it should be recognized that the present disclosure can be practiced without resorting to the details specifically set forth. In other instances, well known processing structures have not been described in detail, in order not to unnecessarily obscure the present disclosure.

An example of the present disclosure is shown and described herein. It is to be understood that the disclosure is capable of use in various other combinations and environments and is capable of changes or modifications within the scope of the inventive concepts as expressed herein.

EXAMPLE

In the example below, the entire assembly is placed in a glove box vented through a fume hood to prevent the loss of the particles to the surrounding air. The pressure in the glove box is held to 35 Pa below the ambient pressure. In this example, particles were sampled for TEM analysis by rapid insertion of copper-supported grids (200 mesh) fastened to the spinning disc, 12.1 cm from the axis, over the flame centerline with a typical insertion time of several milliseconds. An Akashi 002B TEM imaged particles and collected size statistics and a 300 kV Tecnai F30 field emission TEM examined particle structure and morphology. Particle size distribution functions (PSDF) were measured by an SMPS with gas samples gathered online through a pinhole drilled into a tube. The SMPS incorporates a TSI 3080 Electrostatic Classifier and a TSI 3025a Ultrafine Condensation Particle Counter.

Example

In an example of fabricating a dye sensitized solar using the FSRS process, a titania film was deposited onto a fluorine-doped tin oxide layer on a glass substrate (FTO glass). The 3 mm thick FTO glass was obtained from Pilkington, and had a sheet resistance of 7 Ohms/sq and a light transmissivity of ~70%, as reported by the manufacturer. The FTO glass was cut into six 1×3 inch strips, which were mounted onto equal sized grooves in a circular titanium plate 12 inches in diameter, so that the FTO was flush with the surface of the plate. The plate was mounted on a precision stepper motor (Aerotech BM250_UF) and spun at a rate of 300 RPM. An aerodynamically smooth nozzle having an exit diameter of 1 cm was mounted 3.4 cm below the plate at a center-to-center distance of 12.1 cm from the axis of rotation of the plate. A stagnation flame 3 mm below the spinning plate was established by flowing a mixture of ethylene, oxygen, and argon (3.96% $C_2H_4$, 26.53% $O_2$, Ar, equivalence ratio $\phi$=0.45) through the nozzle and igniting the mixture using a spark source. The flow rate of the mixture was 2740 ml/s. Titanium tetraisopropoxide (TTIP, Aldrich 97% pure) was injected into the combustible gas mixture upstream of the nozzle using a syringe pump (Genie Plus, Kent Scientific) to produce a gas phase TTIP concentration of 1070 ppm. The entire flow system was heated to 150° C. to prevent condensation of the TTIP in the line. The particles produced in the flame had an average diameter of 8 nanometers. After 45 minutes of deposition, the film thickness was estimated to be 2.5 microns.

Two samples were taken from the batch. The first was sintered at 450 C for 30 minutes, and the second was placed directly into a staining solution which consisted of ethanol and a Ruthenium-based dye (Solaronix N719). The second sample did not survive the staining process, because the film was completely removed upon submersion in the staining solution. This indicates that the adhesion of the unsintered sample was too weak for further analysis. However, the first sample proved to be robust after sintering, and was successfully stained after 8 hours of submersion in the dye solution.

The stained sample was scraped using a razor blade, so that only a 3×3 mm square remained on the substrate. Next a cathode was fabricated on another piece of FTO glass using a platinum paste (Solaronix, Pt-Catalyst T/SP), which was applied by squeegeeing and sintering at 450 C for 30 minutes. A parafilm spacer cut in the shape of the 3×3 mm square was placed on top of the anode. A drop of the electrolyte (Solaronix, Iodolyte TG-50) was placed on the anode within the parafilm walls, and the cathode was placed on top of the parafilm to complete the cell. The cell was clamped together using alligator clips, and stainless steel leads were used to make contact with both the anode and cathode.

Figure 6:
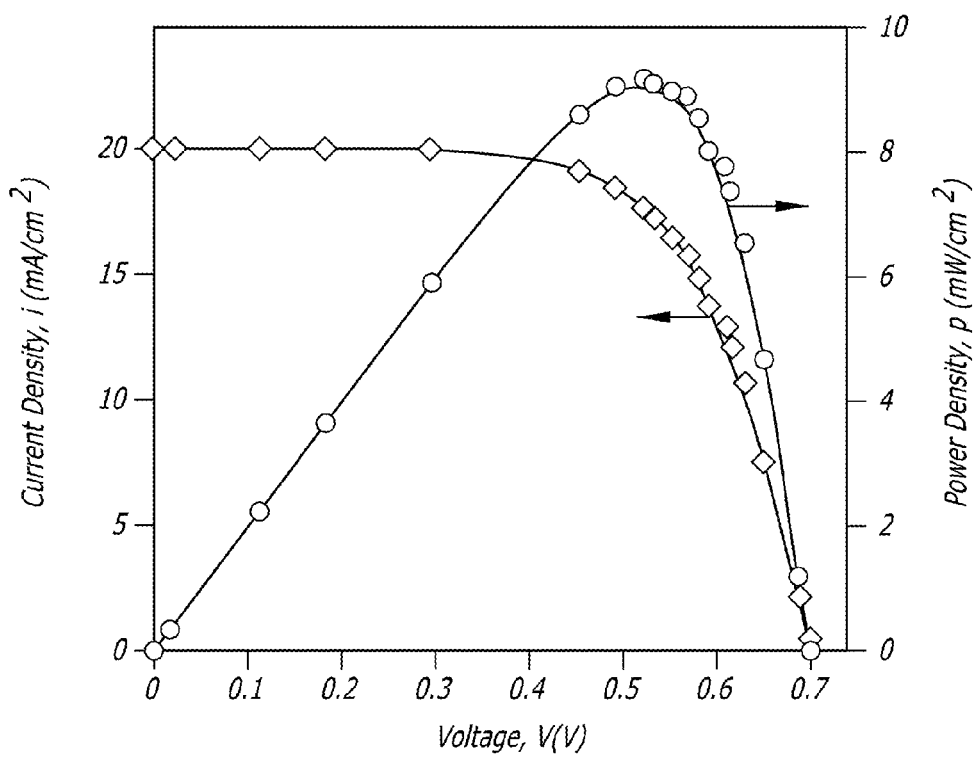
FIG. 6 is a graph showing the current and power densities vs voltage generated under the standard AM1.5 simulated sunlight (1000 W/m$^2$) by a DSSC with its photoanode prepared by the FSRS method.

This cell produced an open circuit voltage of 0.71 V, and closed circuit current of 19 mA/cm$^2$, and a maximum photo efficiency of 9.2%. FIG. 6 shows the current and power densities of the cell vs the voltage produced from the same cell under the standard AM1.5 simulated sunlight. The quality performance of this cell without any optimizing features, such as $TiCl_4$ pre- and post-treatment and addition of a scattering layer indicates that the nanoparticles quality is high and consistent with the theoretically high performance of cells fabricated using the FSRS process.

What is claimed is:

1. A method for manufacturing a dye sensitized nanocrystal film comprising the steps of:
    a) exposing a fluorinated tin oxide (FTO) layer on a surface of a substrate to a flame for a time sufficient to form a layer of crystalline titanium oxide on the FTO layer; and
    b) after step a), sintering the substrate at a temperature of from about 300 to about 500° C. to form a mesoporous nanocrystalline titanium oxide film,
    wherein the flame contains a fuel gas and titanium, and
    wherein during step a), the substrate is rotated about a central axis, and the flame is kept at a constant distance from the surface of the substrate.

2. The method according to claim 1, wherein said fuel gas is comprised of ethylene and oxygen or air.

3. The method according to claim 2, wherein the concentration of titanium in the fuel composition is from about 300 to about 2000 ppm of the total composition of the flame.

4. The method according to claim 1, wherein the substrate is comprised of glass.

5. The method according to claim 1, wherein the substrate is rotated at a speed of from about 100 to about 600 revolutions per minute.

6. The method according to claim 1, wherein during step a), the temperature of the substrate is maintained at a temperature of less than 200° C.

7. The method according to claim 6, wherein the temperature of the substrate is maintained by use of at least one jet of gas directed to the surface of the substrate to cool the surface of the substrate.

8. The method according to claim 7, wherein the jet of gas is one or more from the group consisting of oxygen, nitrogen and argon.

9. The method according to claim 1, wherein the titanium is in the form of titanium tetraisopropoxide.

10. The method of according to claim 2, wherein the fuel gas further comprises argon.

11. The method of claim 1, further comprising a step c), after step b), staining the sintered nanocrystal film with a light-sensitive dye.

* * * * *